US011317507B2

(12) United States Patent
Suzuki et al.

(10) Patent No.: US 11,317,507 B2
(45) Date of Patent: Apr. 26, 2022

(54) LAMINATE AND METHOD FOR MANUFACTURING THE SAME

(71) Applicant: Arisawa Mfg. Co., Ltd., Niigata (JP)

(72) Inventors: Naoki Suzuki, Niigata (JP); Makoto Tai, Niigata (JP); Shuichi Fujita, Niigata (JP)

(73) Assignee: Arisawa Mfg. Co., Ltd., Niigata (JP)

( * ) Notice: Subject to any disclaimer, the term of this patent is extended or adjusted under 35 U.S.C. 154(b) by 0 days.

(21) Appl. No.: 16/978,627

(22) PCT Filed: Feb. 22, 2019

(86) PCT No.: PCT/JP2019/006895

§ 371 (c)(1),
(2) Date: Sep. 4, 2020

(87) PCT Pub. No.: WO2019/171990

PCT Pub. Date: Sep. 12, 2019

(65) Prior Publication Data

US 2020/0413535 A1 Dec. 31, 2020

(30) Foreign Application Priority Data

Mar. 9, 2018 (JP) ............................ JP2018-043346

(51) Int. Cl.

| | |
|---|---|
| ***H05K 1/00*** | (2006.01) |
| ***H05K 1/02*** | (2006.01) |
| ***H05K 1/03*** | (2006.01) |
| ***H05K 1/05*** | (2006.01) |
| ***H05K 1/09*** | (2006.01) |
| ***H05K 3/00*** | (2006.01) |
| ***H05K 3/02*** | (2006.01) |
| ***H05K 3/06*** | (2006.01) |
| ***H05K 3/10*** | (2006.01) |
| ***H05K 3/20*** | (2006.01) |
| ***H05K 3/24*** | (2006.01) |
| ***H05K 3/38*** | (2006.01) |
| ***H05K 3/46*** | (2006.01) |
| ***B32B 15/04*** | (2006.01) |
| ***B32B 15/08*** | (2006.01) |
| ***B32B 15/088*** | (2006.01) |
| ***B32B 15/092*** | (2006.01) |

(52) U.S. Cl.

CPC ........... *H05K 1/0353* (2013.01); *H05K 3/387* (2013.01); *H05K 3/389* (2013.01); *H05K 2201/068* (2013.01)

(58) Field of Classification Search

CPC .. H05K 1/00; H05K 1/02; H05K 1/03; H05K 1/05; H05K 1/09; H05K 1/0353; H05K 3/00; H05K 3/02; H05K 3/06; H05K 3/10; H05K 3/20; H05K 3/24; H05K 3/38; H05K 3/46; H05K 3/387; H05K 3/389

USPC ....... 174/255, 250, 251, 254, 256, 257, 258; 361/525; 427/96.1, 258, 402, 520; 428/141, 209, 212, 344, 458, 606, 607, 428/624; 430/17, 65, 131, 292, 945; 528/34, 35

See application file for complete search history.

(56) References Cited

U.S. PATENT DOCUMENTS

| | | | | | |
|---|---|---|---|---|---|
| 6,044,243 | A * | 3/2000 | Hara | G03G 15/162 | 399/302 |
| 6,180,318 | B1 * | 1/2001 | Fitzer | B41M 5/262 | 430/292 |
| 6,465,114 | B1 * | 10/2002 | Honda | C23C 2/02 | 148/264 |
| 2001/0031317 | A1 * | 10/2001 | Hasegawa | C09D 183/06 | 427/402 |
| 2002/0058147 | A1 * | 5/2002 | Taruishi | G02B 1/11 | 428/447 |
| 2003/0072129 | A1 * | 4/2003 | Kuwako | H01G 4/005 | 361/525 |
| 2003/0096904 | A1 * | 5/2003 | Hakuta | C08F 230/08 | 524/588 |
| 2003/0118927 | A1 * | 6/2003 | Nakamura | G03G 5/14 | 430/65 |
| 2004/0134682 | A1 * | 7/2004 | En | C25D 5/34 | 174/258 |
| 2004/0163842 | A1 * | 8/2004 | Okada | C23C 28/00 | 174/254 |
| 2004/0178492 | A1 * | 9/2004 | Tsukamoto | H01L 23/49822 | 257/690 |
| 2004/0241487 | A1 * | 12/2004 | Nagatani | H05K 3/384 | 428/606 |
| 2005/0106370 | A1 * | 5/2005 | Takai | H05K 3/108 | 428/209 |
| 2005/0202261 | A1 * | 9/2005 | Takai | H05K 3/28 | 428/458 |
| 2006/0210727 | A1 * | 9/2006 | Ibuki | G02B 1/111 | 428/1.31 |

(Continued)

FOREIGN PATENT DOCUMENTS

| | | |
|---|---|---|
| JP | 2005-116745 A | 4/2005 |
| JP | 2006-054357 A | 2/2006 |

(Continued)

OTHER PUBLICATIONS

International Search Report and Written Opinion dated Apr. 23, 2019 in connection with PCT/JP2019/006895.

(Continued)

*Primary Examiner* — Xiaoliang Chen
(74) *Attorney, Agent, or Firm* — Wolf, Greenfield & Sacks, P.C.

(57) ABSTRACT

A laminate comprising a substrate; an adhesive layer formed on at least one surface of both surfaces of the substrate so as to be in direct contact with the substrate; and a plating layer formed on a surface of the adhesive layer opposite to the substrate, wherein the adhesive layer comprises a plating catalyst containing a precious metal, and a silane coupling agent.

15 Claims, No Drawings

(56) References Cited

U.S. PATENT DOCUMENTS

2007/0015893 A1* 1/2007 Hakuta ................. C08F 230/08 528/34
2007/0207337 A1* 9/2007 Nagatani .............. H05K 3/4655 428/607
2007/0237976 A1* 10/2007 Okada ...................... C25D 5/12 428/606
2007/0272124 A1* 11/2007 Tsutsumi ................... C08J 5/18 106/287.24
2008/0314618 A1* 12/2008 Shimoosako .......... C09J 179/08 174/250
2009/0220696 A1* 9/2009 Chung ................. C09D 11/037 427/258
2009/0238602 A1* 9/2009 Iwasaki .................. G03G 5/064 399/111
2009/0266589 A1* 10/2009 Shimokawa ............. H05K 3/26 174/256
2009/0288857 A1* 11/2009 Shimizu ............... H05K 3/4038 174/250
2010/0233476 A1* 9/2010 Uchida ................... B32B 15/20 428/344
2011/0005812 A1* 1/2011 Shimokawa ............ B32B 15/08 174/255
2011/0109970 A1* 5/2011 Abe ......................... G03B 9/02 359/601
2011/0159245 A1* 6/2011 Taniguchi ............... B29C 33/56 428/172
2011/0164297 A1* 7/2011 Abe .................... C23C 14/0015 359/227
2011/0318602 A1* 12/2011 Yoshida ................. H05K 3/388 428/621
2012/0070677 A1* 3/2012 You .................... C08G 73/1046 428/458
2012/0135266 A1* 5/2012 Kaminaga ................ C25D 5/14 428/624
2012/0247814 A1* 10/2012 Shimizu ............... H05K 3/4644 174/251
2012/0251932 A1* 10/2012 Iwasaki ................ G03G 5/0614 430/56
2012/0251933 A1* 10/2012 Yamamoto ......... G03G 5/14791 430/56
2013/0065169 A1* 3/2013 Iwasaki ................ G03G 5/0614 430/56
2013/0252152 A1* 9/2013 Kawabata .............. G03G 15/00 430/56
2013/0279001 A1* 10/2013 Mochizuki ............. G02B 1/105 359/361
2014/0083745 A1* 3/2014 Shimizu ............... H05K 3/4652 174/251
2014/0248478 A1* 9/2014 Saito ........................ C08J 7/042 428/215
2014/0342137 A1* 11/2014 Kim ....................... H05K 1/036 428/212
2015/0175317 A1* 6/2015 Imai ..................... C09D 5/1693 220/200
2015/0291737 A1* 10/2015 Tajima .................... C08L 83/00 524/588
2016/0052244 A1* 2/2016 Kuriyama ............... B32B 27/30 428/212
2016/0216621 A1* 7/2016 Miyamoto ............. G03G 5/144
2019/0270280 A1* 9/2019 Arisawa ................ B32B 15/092
2020/0122428 A1* 4/2020 Shido ........................ B32B 5/26

FOREIGN PATENT DOCUMENTS

WO 2013/065628 A1 5/2013
WO 2014/051061 A1 4/2014

OTHER PUBLICATIONS

PCT/JP2019/006895, Apr. 23, 2019, International Search Report and Written Opinion.

* cited by examiner

LAMINATE AND METHOD FOR MANUFACTURING THE SAME

CROSS-REFERENCE TO RELATED APPLICATIONS

This application is a national stage filing under 35 U.S.C. 371 of International Patent Application No. PCT/JP2019/006895, filed Feb. 22, 2019, which claims priority to Japanese Application No. 2018-043346, filed Mar. 9, 2018. The entire contents of these applications are incorporated herein by reference in their entirety.

TECHNICAL FIELD

The present invention relates to a laminate and a method for manufacturing the same.

BACKGROUND ART

As a metal laminate used for a flexible printed circuit (hereinafter also referred to as an "FPC") or the like, a flexible printed circuit laminate is known in which a plating layer is formed by performing plasma treatment and silane coupling treatment on the surface of a polyimide film having insulating properties, and performing plating treatment on this treated surface via a catalyst comprising a precious metal compound (see, for example, Patent Literature 1).

The laminate described in Patent Literature 1 is a structure having thermoplastic polyimide layers on the front and back of a polyimide film. In the method described in this literature, plasma treatment is performed on the surfaces of thermoplastic polyimide layers to adjust the surface roughness at 50 to 200 nm. Then, the surfaces of the thermoplastic polyimide layers subjected to the plasma treatment are silane coupling-treated, and a catalyst comprising a precious metal compound is attached to the silane coupling-treated surfaces to obtain a laminate precursor. Thus, the thermoplastic polyimide layers and the precious metal catalyst can be closely adhered to each other via the silane coupling agent complementing the precious metal catalyst. Then, the obtained laminate precursor is subjected to electroless plating treatment and electroplating treatment, and thus a flexible printed circuit laminate is obtained.

CITATION LIST

Patent Literature

Patent Literature 1: Japanese Patent Laid-Open No. 2006-54357

SUMMARY OF INVENTION

Technical Problem

However, further improvement of solder heat resistance and moist heat resistance is required for the laminate in Patent Literature 1.

Accordingly, it is an object of the present invention to provide a laminate in which solder heat resistance and moist heat resistance can be improved compared with conventional laminates, and a method for manufacturing the same.

Solution to Problem

The present inventors have studied diligently in order to solve the above problem, and, as a result, found that the above problem can be solved by a laminate comprising a substrate, an adhesive layer formed on at least one surface of both surfaces of the substrate so as to be in direct contact with the substrate, and a plating layer formed on the surface of the adhesive layer opposite to the substrate, wherein the adhesive layer comprises a plating catalyst containing a precious metal, and a silane coupling agent. Thus, the present inventors have completed the present invention.

Specifically, the present invention is as follows.

(1)

A laminate comprising a substrate; an adhesive layer formed on at least one surface of both surfaces of the substrate so as to be in direct contact with the substrate; and a plating layer formed on a surface of the adhesive layer opposite to the substrate, wherein the adhesive layer comprises a plating catalyst containing a precious metal, and a silane coupling agent.

(2)

The laminate of (1), wherein the adhesive layer has a silane coupling layer comprising the silane coupling agent, and a catalyst layer containing the plating catalyst, and the silane coupling layer and the catalyst layer are laminated in this order from the substrate toward the plating layer.

(3)

The laminate of (1) or (2), wherein a thickness of the adhesive layer in a lamination direction is 0.001 to 2 μm.

(4)

The laminate of any of (1) to (3), wherein the substrate has a linear thermal expansion coefficient of 20 ppm/K or less.

(5)

The laminate of any of (1) to (4), wherein the substrate has a glass transition temperature of 300° C. or more.

(6)

The laminate of any of (1) to (5), wherein a resin in the substrate is a thermosetting polyimide resin.

(7)

The laminate of any of (1) to (6), wherein the silane coupling agent is a silane coupling agent containing an amino group, or a silane coupling agent containing an epoxy group.

(8)

The laminate of any of (1) to (7), wherein the resin in the substrate is a thermosetting polyimide resin, and the silane coupling agent is a silane coupling agent containing an amino group, or a silane coupling agent containing an epoxy group.

(9)

The laminate of (8), wherein the silane coupling agent is a silane coupling agent containing an epoxy group.

(10)

The laminate of any of (1) to (9), wherein an average roughness Ra of at least one surface of the both surfaces of the substrate is 0.15 μm or less.

(11)

The laminate of any of (1) to (9), wherein each average roughness Ra of the both surfaces of the substrate is 0.15 μm or less.

(12)

The laminate of any of (1) to (11), wherein the adhesive layer contains a binder.

(13)

The laminate of (12), wherein the binder is a thermosetting polyimide resin.

(14)

The laminate of any of (1) to (13), wherein peel strength after charging into a thermo-hygrostat at a temperature of 85° C. and a humidity of 85% for 240 h is 3 N/cm or more in terms of 180° direction peeling.

(15)

The laminate of any of (1) to (14), wherein the adhesive layer has a first adhesive layer formed on one surface of both surfaces of the substrate so as to be in direct contact with the substrate, and a second adhesive layer formed on the other surface of both surfaces of the substrate so as to be in direct contact with the substrate, and the plating layer has a first plating layer formed on a surface of the first adhesive layer opposite to the substrate, and a second plating layer formed on a surface of the second adhesive layer opposite to the substrate.

(16)

A method for manufacturing a laminate, comprising: an adhesive layer forming step of applying a silane coupling agent and a plating catalyst raw material containing a precious metal on at least one surface of a substrate and drying the silane coupling agent and the plating catalyst raw material to form an adhesive layer; and a plating layer forming step of performing plating treatment on a surface of the adhesive layer opposite to the substrate to form a plating layer.

Advantageous Effects of Invention

According to the present invention, a laminate in which solder heat resistance and moist heat resistance can be improved, and a method for manufacturing the same can be provided.

DESCRIPTION OF EMBODIMENTS

A mode for carrying out the present invention (hereinafter referred to as "this embodiment") will be described in detail below. The present invention is not limited to the following embodiment, and various modifications can be made without departing from the spirit thereof.

[Laminate]

The laminate of this embodiment comprises a substrate; an adhesive layer formed on at least one surface of both surfaces of the substrate so as to be in direct contact with the substrate; and a plating layer formed on the surface of the adhesive layer opposite to the substrate. The adhesive layer comprises a plating catalyst containing a precious metal, and a silane coupling agent. Since the laminate of this embodiment has the above configuration, the solder heat resistance and the moist heat resistance can be improved. In addition, since the laminate of this embodiment has the above configuration, for example, the peel strength at normal temperature is excellent, and a decrease in peel strength tends to be able to be suppressed even after moist heat treatment.

(Substrate)

The resin in the substrate is not particularly limited, and examples thereof include thermosetting polyimide resins, liquid crystal polymers, polyphenylene sulfide, syndiotactic polystyrene, polyethylene terephthalate, polyethylene naphthalate, polycarbonates, polybutylene terephthalate, polyether ether ketone, and fluorine resins. One of these resins is used alone, or two or more of these resins are used in combination. Among these, the resin is preferably a thermosetting polyimide resin from the viewpoint of better mechanical characteristics, better thermal characteristics, and better dimensional stability during heating. In a flexible printed circuit in which a high frequency signal is transmitted, the resin is preferably a liquid crystal polymer or a fluorine resin from the viewpoint of dielectric characteristics. Liquid crystal polymers and fluorine resins have a low water absorption rate, and therefore the moist heat resistance characteristics, the dimensional stability under high humidity, and the peel strength after moisture absorption treatment also tend to be good.

The thermosetting polyimide resin is not particularly limited, and examples thereof include condensation type polyimide resins obtained by copolymerizing an acid dianhydride and a diamine, bismaleimide resins, and maleimide resins.

As the acid dianhydride and the diamine, any of aliphatic compounds, alicyclic compounds, and aromatic compounds can be used. But, from the viewpoint of heat resistance, as the acid dianhydride, aromatic tetracarboxylic dianhydrides are preferred, and as the diamine, aromatic diamines are preferred.

Examples of the acid dianhydride include pyromellitic dianhydride, 2,3,6,7-naphthalenetetracarboxylic dianhydride, 3,3',4,4'-biphenyltetracarboxylic dianhydride, 1,2,5,6-naphthalenetetracarboxylic dianhydride, 2,2',3,3'-biphenyltetracarboxylic dianhydride, 3,3',4,4'-benzophenonetetracarboxylic dianhydride, 4,4'-oxydiphthalic dianhydride, 2,2-bis(3,4-dicarboxyphenyl)propane dianhydride, 3,4,9,10-perylenetetracarboxylic dianhydride, bis(3,4-dicarboxyphenyl)propane dianhydride, 1,1-bis(2,3-dicarboxyphenyl)ethane dianhydride, 1,1-bis(3,4-dicarboxyphenyl) ethane dianhydride, bis(2,3-dicarboxyphenyl)methane dianhydride, bis(3,4-dicarboxyphenyl)ethane dianhydride, bis(3,4-dicarboxyphenyl) sulfone dianhydride, p-phenylenebis(trimellitic acid monoester anhydride), ethylenebis(trimellitic acid monoester anhydride), and bisphenol A bis(trimellitic acid monoester anhydride). One of these acid dianhydrides is used alone, or two or more of these acid dianhydrides are used in combination. Among these, at least one acid dianhydride selected from the group consisting of pyromellitic dianhydride, 2,3,6,7-naphthalenetetracarboxylic dianhydride, 2,2',3,3'-biphenyltetracarboxylic dianhydride, 3,3',4,4'-biphenyltetracarboxylic dianhydride, and 3,3',4,4'-benzophenonetetracarboxylic dianhydride is preferred from the viewpoint of heat resistance and dimensional stability.

Examples of the diamine include 4,4'-diaminodiphenylpropane, 4,4'-diaminodiphenylmethane, benzidine, 3,3'-dichlorobenzidine, 3,3'-dimethylbenzidine, 2,2'-dimethylbenzidine, 3,3'-dimethoxybenzidine, 2,2'-dimethoxybenzidine, 4,4'-diaminodiphenyl sulfide, 3,3'-diaminodiphenyl sulfone, 4,4'-diaminodiphenyl sulfone, 4,4'-oxydianiline, 3,3'-oxydianiline, 3,4'-oxydianiline, 1,5-diaminonaphthalene, 2,6-diaminonaphthalene, 4,4'-diaminodiphenyldiethylsilane, 4,4'-diaminodiphenylsilane, 4,4'-diaminodiphenylethylphosphine oxide, 4,4'-diaminodiphenyl N-methylamine, 4,4'-diaminodiphenyl N-phenylamine, 1,4-diaminobenzene (p-phenylenediamine), 1,3-diaminobenzene, 1,2-diaminobenzene, bis{4-(4-aminophenoxy)phenyl} sulfone, bis{4-(3-aminophenoxy)phenyl} sulfone, 4,4'-bis(4-aminophenoxy)biphenyl, 4,4'-bis(3-aminophenoxy)biphenyl, 1,3-bis(3-aminophenoxy)benzene, 1,3-bis(4-aminophenoxy) benzene, 1,4-bis(4-aminophenoxy)benzene, 3,3'-diaminobenzophenone, 4,4'-diaminobenzophenone, and 2,2-bis[4-(4-aminophenoxy)phenyl)]propane. One of these diamines is used alone, or two or more of these diamines are used in combination. Among these, at least one diamine selected from the group consisting of 3,3'-dimethylbenzidine, 2,2'-dimethylbenzidine, 3,3'-dimethoxybenzidine, 2,2'-dimethoxybenzidine, 1,5-diaminonaphthalene, and 1,4-diaminobenzene (p-phenylenediamine) is preferably contained from the viewpoint of heat resistance and dimensional stability.

The substrate may contain components other than resins in a range that does not impair the effect of the present invention.

The substrate is preferably a resin film, more preferably a thermosetting polyimide resin film in which the resin in the resin film is a thermosetting polyimide resin. For the thermosetting polyimide resin film, a prepared product prepared by a known method, or a commercial product may be used. Examples of the commercial product include “Kapton EN series”, “Kapton H series”, and “Kapton V series”, products of DU PONT-TORAY CO., LTD., “APICAL HP series” and “APICAL NPI series”, products of KANEKA CORPORATION, and “Upilex S”, a product of Ube Industries, Ltd.

The thickness of the substrate in the lamination direction is preferably 5 to 500 μm from the viewpoint of conveying properties, insulating properties, heat resistance, and the like. From a similar viewpoint, the thickness of the substrate in the lamination direction is more preferably 10 to 300 μm, further preferably 20 to 100 μm.

The substrate preferably has a linear thermal expansion coefficient of 20 ppm/K or less (for example, 3 to 20 ppm/K). When the substrate has a linear thermal expansion coefficient equal to or less than the particular value, the dimensional stability, the peel strength, and the heat resistance tend to be able to be further improved. From a similar viewpoint, the thermal expansion coefficient is more preferably 17 ppm/K or less, further preferably 10 ppm/K or less. The linear thermal expansion coefficient is obtained, for example, from a measured value obtained at a temperature increase rate of 10° C./min in the range of 100 to 150° C. using a TMA (thermomechanical analyzer).

The substrate preferably has a glass transition temperature of 300° C. or more (for example, 300 to 400° C.) When the substrate has a glass transition temperature equal to or more than the particular value, the peel strength and the heat resistance tend to be able to be further improved in the laminate. From a similar viewpoint, the glass transition temperature is more preferably 320° C. or more, further preferably 350° C. or more. The glass transition temperature is obtained, for example, from the value of the inflection point of a storage modulus measured by a dynamic viscoelasticity measuring apparatus (DMA).

The average roughness Ra of at least one surface of both surfaces of the substrate (particularly each average roughness Ra of both surfaces of the substrate) is preferably 0.15 μm or less (for example, 0.02 to 0.15 μm). When the average roughness Ra of at least one surface of both surfaces of the substrate is 0.15 μm or less, that is, a surface of the substrate is smooth, the adhesive layer and the plating layer can be evenly provided on the entire substrate. As a result, the laminate has no or few voids between the substrate and the adhesive layer or between the adhesive layer and the plating layer. Since such a laminate has no or few voids, poor connection due to voids do not occur even in a heating step or under high temperature and high humidity, and the moist heat resistance characteristics and the heat resistance improve further. Further, the substrate, the adhesive layer, and the plating layer adhere without gaps, and therefore the areas of contact between the layers are sufficiently ensured, and the peel strength, the moist heat resistance, and the heat resistance tend to be able to be further improved. From a similar viewpoint, the average roughness Ra is more preferably 0.10 μm or less, further preferably 0.07 μm or less. The average roughness Ra is obtained by measuring the 10-point average roughness of a surface of the substrate in accordance with JIS B0601-1976.

(Adhesive Layer)

The adhesive layer comprises a silane coupling agent and a plating catalyst containing a precious metal.

The silane coupling agent is not particularly limited, and examples thereof include silane coupling agents containing an amino group (hereinafter also referred to as “amino silane coupling agents”), silane coupling agents containing an epoxy group (hereinafter also referred to as “epoxy silane coupling agents”), and silane coupling agents containing a mercapto group (for example, 3-mercaptopropyltrimethoxysilane, 3-mercaptopropyltriethoxysilane, 3-mercaptopropylmethyldimethoxysilane, and 11-mercaptoundecyltrimethoxysilane), ureido silane coupling agents containing an ureido group (for example, 3-ureidopropyltriethoxysilane), vinyl silane coupling agents containing a vinyl group (for example, vinyltrimethoxysilane, vinyltriethoxysilane, and vinylmethyldiethoxysilane), styryl silane coupling agents containing a styryl group (for example, p-styryltrimethoxysilane); (meth)acrylate silane coupling agents containing a (meth)acryloyl group (for example, 3-acryloxypropyltrimethoxysilane and 3-methacryloxypropyltrimethoxysilane), isocyanate silane coupling agents containing an isocyanate group (for example, 3-isocyanatepropyltrimethoxysilane), sulfide silane coupling agents containing a sulfide group (for example, bis(triethoxysilylpropyl)disulfide and bis(triethoxysilylpropyl) tetrasulfide), methacryloxypropyltrimethoxysilane, imidazole silane, and triazine silane. One of these silane coupling agents is used alone, or two or more of these silane coupling agents are used in combination. Among these, the silane coupling agent is preferably an amino silane coupling agent or an epoxy silane coupling agent, more preferably an epoxy silane coupling agent, from the viewpoint of being able to further improve the peel strength, the moist heat resistance, and the heat resistance. Particularly, for the silane coupling agent, from the viewpoint of being able to further improve the peel strength, the moist heat resistance, and the heat resistance, it is preferred that the resin in the substrate is a thermosetting polyimide resin, and the silane coupling agent is an amino silane coupling agent or an epoxy silane coupling agent, and it is more preferred that the resin in the substrate is a thermosetting polyimide resin, and the silane coupling agent is an epoxy silane coupling agent.

Examples of the amino silane coupling agent include 3-aminopropyltrimethoxysilane, 3-aminopropyltriethoxysilane, 3-aminopropyldimethoxymethylsilane, N-phenyl-3-aminopropyltrimethoxysilane, N-methylaminopropyltrimethoxysilane, N-(2-aminoethyl)-3-aminopropyltrimethoxysilane, and N-(2-aminoethyl)-3-aminopropyldimethoxymethylsilane. For the amino silane coupling agent, a commercial product may be used, and examples of the commercial product include “KBM-903”, “KBE-903”, “KBM-573”, “KBM-602”, “KBM-603”, and “KBM-6803”, products of Shin-Etsu Chemical Co., Ltd.

Examples of the epoxy silane coupling agent include 3-glycidyloxypropyltrimethoxysilane, 3-glycidyloxypropyltriethoxysilane, 3-glycidyloxypropyl(dimethoxy)methylsilane, and 2-(3,4-epoxycyclohexyl) ethyltrimethoxysilane. For the epoxy silane coupling agent, examples of commercial products include “X-12-1231”, “KBM-403”, “KBM-303”, “KBM-402”, “KBE-403”, “KBE-402”, and “KBM-4803”, products of Shin-Etsu Chemical Co., Ltd.

The content of the silane coupling agent based on the entire adhesive layer is, for example, 0.01 to 10% by mass, preferably 0.05 to 2% by mass, and more preferably 0.1 to 1% by mass.

The plating catalyst contains a precious metal. The plating catalyst should be a catalyst usually used for plating treatment (for example, electroless plating treatment). Examples of the precious metal include palladium, platinum, nickel, silver, gold, and alloys thereof. One of these precious metals is used alone, or two or more of these precious metals are used in combination. Among these, the precious metal is preferably palladium from the viewpoint of the stability of the metal simple substance, the reactivity as the plating catalyst, catalyst removability after circuit formation, and migration resistance.

For the plating catalyst, the precious metal is desirably colloidally or uniformly dispersed in a solvent from the viewpoint of uniformly depositing the plating layer on the surface of the adhesive layer. The solvent is not particularly limited, and examples thereof include those usually used for dispersing particles of a precious metal. Examples thereof include water, alcohols such as methanol, ethanol, and isopropyl alcohol, hexane, cyclohexanone, methyl ethyl ketone, acetone, N-methyl-2-pyrrolidone, N,N-dimethylacetamide, N,N-dimethylformamide, toluene, diethyl ether, tetrahydrofuran (THF), and mixed solvents thereof. A dispersing agent can be further added as needed, within a range that does not impair the effect of the present invention. The dispersing agent is not particularly limited, and examples thereof include those usually used for dispersing particles of a precious metal. Examples of the dispersing agent include alkylolammonium salts having an acid group, unsaturated acidic polycarboxylic acid polyesters, polysiloxanes, and mixtures thereof.

The average particle diameter (D50) of particles of the precious metal may be, for example, about 2 to 40 nm. The average particle diameter is a volume-based average particle diameter and is obtained, for example, by a particle diameter distribution measuring apparatus according to a dynamic light scattering method (DLS). D50 means the position of a volume accumulation of 50%.

The content of the plating catalyst based on the entire adhesive layer is, for example, 1 to 99% by mass, preferably 10 to 80% by mass, and more preferably 20 to 60% by mass.

The adhesive layer can further contain a binder in a range that does not influence the dispersibility of the precious metal. When the adhesive layer contains a binder, the heat resistance can be further improved in the laminate, and the close adhesiveness between the substrate and the plating layer improves further via the adhesive layer, and as a result, the peel strength tends to be able to be further improved.

The binder is not particularly limited, and examples thereof include binders usually used for improving thermal characteristics and mechanical characteristics. Among these, the binder is preferably a thermosetting polyimide resin from the viewpoint that when the resin in the substrate is a thermosetting polyimide resin, the close adhesiveness between the substrate and the plating layer improves further. Examples of the thermosetting polyimide resin include the thermosetting polyimide resins illustrated in the section on the resin in the substrate. One of these thermosetting polyimide resins is used alone, or two or more of these thermosetting polyimide resins are used in combination.

The content of the binder based on the entire adhesive layer is, for example, 1 to 99% by mass, preferably 20 to 90% by mass, and more preferably 40 to 80% by mass.

The adhesive layer may have a single layer structure or a multilayer structure. When the adhesive layer has a multilayer structure, examples of the multilayer structure include a multilayer structure having a silane coupling layer comprising a silane coupling agent, and a catalyst layer containing a plating catalyst. When the adhesive layer has the above multilayer structure, for example, the silane coupling layer and the catalyst layer are laminated in this order from the substrate toward the plating layer. The multilayer structure may be composed of a silane coupling layer and a catalyst layer, or may be composed of a silane coupling layer, a catalyst layer, and one or more other layers other than a silane coupling layer and a catalyst layer in a range that does not impair the effect of the present invention. From the viewpoint of further improving the peel strength, the moist heat resistance, and the heat resistance, it is preferred that the adhesive layer has a silane coupling layer and a catalyst layer, and the silane coupling layer and the catalyst layer are laminated in this order from the substrate toward the plating layer. The silane coupling layer and the catalyst layer conform well to the irregularities on the substrate surface and can be evenly provided on the entire substrate. Thus, the substrate and the silane coupling layer adhere well to each other, and the silane coupling layer and the catalyst layer adhere well to each other. Particularly, the silane coupling layer forms strong chemical bonds with the substrate surface by the functional groups of the silane coupling agent. Further, the silane coupling layer can form strong bonds with the catalyst by hydrogen bonds. In addition, the silane coupling layer and the catalyst layer conform well to the irregularities on the substrate, and therefore the layers adhere without gaps, and as a result, the occurrence of voids between the layers can be prevented. Thus, the laminate does not cause poor joining due to voids even in a heating step and a high temperature and high humidity environment, and the moist heat resistance and the moist heat resistance characteristics tend to improve further. The silane coupling agent contained in the silane coupling layer is not particularly limited, and, for example, the silane coupling agent used in the adhesive layer can be used.

The plating catalyst contained in the catalyst layer is not particularly limited, and, for example, the plating catalyst used in the adhesive layer can be used.

The thickness of the adhesive layer in the lamination direction is preferably 0.001 to 2 μm. When the thickness is 0.001 μm or more, the moist heat resistance tends to improve further in the laminate. When the thickness is 2 μm or less, the laminate tends to be able to further keep the mechanical characteristics, thermal characteristics, and electrical characteristics of the substrate. From a similar viewpoint, the thickness of the adhesive layer in the lamination direction is more preferably 0.01 to 1 μm, further preferably 0.02 to 0.5 μm, and particularly preferably 0.03 to 0.1 μm.

(Plating Layer)

Examples of the plating layer include a metal plating layer formed by metal plating treatment. Examples of the metal plating layer include a copper plating layer, a gold plating layer, a tin plating layer, a nickel plating layer, a silver plating layer, a palladium plating layer, a solder plating layer, and a lead-free solder plating layer. Among these, the plating layer is usually a copper plating layer in many cases.

The thickness of the plating layer in the lamination direction is preferably 0.1 to 35 μm, more preferably 0.2 to 20 μm, and further preferably 0.3 to 18 μm from the viewpoint of more effectively and reliably achieving the effect of the present invention.

The laminate of this embodiment may have a form in which the adhesive layer and the plating layer are laminated in this order on one surface side of the substrate, or a form in which the adhesive layer and the plating layer are laminated in this order on both surface sides of the substrate. In the laminate of this embodiment, it is preferred that the adhesive layer has a first adhesive layer formed on one surface of both surfaces of the substrate so as to be in direct contact with the substrate, and a second adhesive layer formed on the other surface of both surfaces of the substrate so as to be in direct contact with the substrate, and the plating layer has a first plating layer formed on the surface of the first adhesive layer opposite to the substrate, and a second plating layer formed on the surface of the second adhesive layer opposite to the substrate. The first adhesive layer and the second adhesive layer may be the same or different, and the first plating layer and the second plating layer may be the same or different.

(Characteristics)

The laminate of this embodiment is excellent in moist heat resistance, and the peel strength after charging into a thermo-hygrostat at a temperature of 85° C. and a humidity of 85% for 240 h is, for example, 3 N/cm or more (for example, 3 to 5 N/cm), preferably 3.1 N/cm or more, and more preferably 3.3 N/cm or more in terms of 180° direction peeling.

(Applications)

The laminate of this embodiment is preferably used as a flexible printed circuit material. A flexible printed circuit is preferably used, for example, as a so-called chip-on flexible printed circuit for IC chip mounting.

[Method for Manufacturing Laminate]

The method for manufacturing a laminate in this embodiment contains the adhesive layer forming step of applying a silane coupling agent and a plating catalyst raw material containing a precious metal to at least one surface of a substrate so as to be in direct contact with the substrate, and drying the silane coupling agent and the plating catalyst raw material to form an adhesive layer; and the plating layer forming step of performing plating treatment on the surface of the adhesive layer opposite to the substrate to form a plating layer. Since the manufacturing method of this embodiment has the above configuration, the solder heat resistance and moist heat resistance of the obtained laminate can be improved. In addition, since the manufacturing method of this embodiment has the above configuration, for example, the peel strength of the obtained laminate tends to be excellent.

(Adhesive Layer Forming Step)

The adhesive layer forming step is the step of applying a silane coupling agent and a plating catalyst raw material containing a precious metal on at least one surface of a substrate and drying the silane coupling agent and the plating catalyst raw material to form an adhesive layer.

The substrate is not particularly limited, and examples thereof include those illustrated as the substrate in the section on the laminate.

The silane coupling agent is not particularly limited, and examples thereof include those illustrated as the silane coupling agent in the section on the laminate. In the adhesive layer forming step, for example, the silane coupling agent is used in the form of being dissolved or dispersed in an organic solvent. The organic solvent is not particularly limited as long as it is a solvent capable of dissolving or dispersing the silane coupling agent. Examples thereof include alcohols (for example, methanol, ethanol, propanol, butanol, pentanol, glycerin, ethylene glycol, diethylene glycol, triethylene glycol, polyethylene glycol, propylene glycol, dipropylene glycol, trimethylolethane, and trimethylolpropane), ethers (for example, alkyl ethers such as butyl ethyl ether, polyhydric alcohol alkyl ethers such as ethylene glycol mono-n-butyl ether, and polyhydric alcohol aryl ethers such as ethylene glycol monophenyl ether), ketones (for example, methyl ethyl ketone, methyl isobutyl ketone, and cyclopentanone), esters (for example, butyl acetate, propyl propionate, and methyl ether acetate), amides (for example, N,N-dimethylformaldehyde), amines (for example, monoethanolamine and diethanolamine), aromatic hydrocarbons (for example, toluene and xylene), sulfur-containing compounds (for example, dimethyl sulfoxide), and nitrogen-containing heterocyclic compounds (for example, 2-pyrrolidone). One of these organic solvents is used alone, or two or more of these organic solvents are used in combination. The concentration of the silane coupling agent in the organic solvent is not particularly limited and may be, for example, about 0.1 to 10% by mass.

The plating catalyst raw material contains a precious metal. The precious metal is not particularly limited, and examples thereof include palladium, silver, gold, platinum, nickel, and alloys thereof. One of these precious metals is used alone, or two or more of these precious metals are used in combination.

For the plating catalyst raw material, a precious metal may be directly added, or a precious metal compound and a reducing agent for reducing the precious metal compound to obtain a precious metal may be added to deposit the precious metal in the plating catalyst raw material by a reduction reaction. The precious metal compound is not particularly limited, and examples thereof include palladium compounds (for example, palladium chloride, palladium fluoride, palladium bromide, palladium iodide, palladium nitrate, palladium sulfate, palladium oxide, and palladium sulfide), silver compounds (for example, silver nitrate, silver fluoride, silver oxide, and silver acetate), gold compounds (for example, gold cyanide, gold trichloride, gold tribromide, gold potassium chloride, gold potassium cyanide, gold sodium chloride, and gold sodium cyanide), platinum compounds (for example, platinum chloride and platinum sulfate), and nickel compounds (for example, nickel chloride and nickel sulfate). One of these precious metal compounds is used alone, or two or more of these precious metal compounds are used in combination. The reducing agent is not particularly limited, and examples thereof include metal borohydride salts (for example, sodium borohydride and potassium borohydride), aluminum hydride salts (for example, lithium aluminum hydride, potassium aluminum hydride, cesium aluminum hydride, beryllium aluminum hydride, magnesium aluminum hydride, and calcium aluminum hydride), hydrazine compounds, carboxylic acids (for example, citric acid, gallic acid, formic acid, acetic acid, fumaric acid, malic acid, succinic acid, ascorbic acid, and salts thereof), primary or secondary alcohols (for example, methanol, ethanol, isopropanol, and polyols), tertiary amines (for example, trimethylamine, triethylamine, diisopropylethylamine, diethylmethylamine, tetramethylethylenediamine [TMEDA], and ethylenediaminetetraacetic acid [EDTA]), hydroxylamine, ketones (for example, acetone and methyl ethyl ketone), ethers (for example, diethyl ether), aldehydes (for example, formaldehyde and acetaldehyde), esters (for example, methyl formate, methyl acetate, and ethyl acetate), and phosphines (for example, tri-n-propylphosphine, tri-n-butylphosphine, tricyclohexylphosphine, tribenzylphosphine, triphenylphosphine, triethoxyphosphine, 1,2-bis(diphenylphosphino)ethane [DPPE], 1,3-bis(diphenylphosphino)propane [DPPP], 1,1'-bis(diphenylphosphino)ferrocene [DPPF], and 2,2'-bis(diphenylphosphino)-1,1'-binaphthyl [BINAP]). One of these reducing agents is used alone, or two or more of these reducing agents are used in combination.

The amount of the reducing agent used is not particularly limited and may be, for example, about 10 to 1000 parts by mass based on 100 parts by mass of the precious metal compound.

The plating catalyst raw material may further contain a binder. Examples of the binder include the supports illustrated in the section on the laminate.

In the adhesive layer forming step, it is possible to apply, on at least one surface of a substrate, a mixed raw material obtained by mixing a silane coupling agent and a plating catalyst raw material, and dry the mixed raw material to form an adhesive layer. In the adhesive layer forming step, it is possible to apply a silane coupling agent on at least one surface of a substrate and dry the silane coupling agent to form a silane coupling layer, and apply a plating catalyst raw material on the surface of the silane coupling layer and dry the plating catalyst raw material to form a catalyst layer. In this case, the adhesive layer is composed of the silane coupling layer and the catalyst layer.

The method for applying each of the silane coupling agent and the plating catalyst raw material in the adhesive layer forming step is not particularly limited, and examples thereof include a roll coating method, a kiss roll coating method, a gravure coating method, a reverse coating method, a roll brush method, a spray coating method, a dip roll coating method, a bar coating method, a knife coating method, an air knife coating method, a curtain coating method, a lip coating method, and a die coater method.

In the adhesive layer forming step, the drying conditions are not particularly limited. The drying temperature may be, for example, about 60 to 240° C., and the drying time may be, for example, about 5 to 30 min. The drying temperature may be changed stepwise or kept constant.

(Plating Layer Forming Step)

The plating layer forming step is the step of performing plating treatment on the surface of the adhesive layer opposite to the substrate to form a plating layer. Examples of the plating treatment include electroless plating treatment, electroplating treatment, and treatment combining these. Among these plating treatments, electroless plating treatment is preferably used because it can be applied to a semi-additive method, which is one of pattern forming methods, and can adapt to pitch narrowing on both surfaces.

The treatment conditions of electroless plating treatment and electroplating treatment are not particularly limited, and known treatment conditions are used. More particularly, for example, the treatment conditions described in Examples can be used.

The physical properties herein can be measured according to the methods described in the following Examples unless otherwise specified.

EXAMPLES

The present invention will be more specifically described below by Examples and Comparative Examples, but the present invention is not limited to only these Examples.

Example 1

A 2% by mass methanol solution of an epoxy silane coupling agent ("KBM-403", product of Shin-Etsu Chemical Co., Ltd.) was applied to one surface of a thermosetting polyimide resin film having a thickness of 38 μm ("Kapton 150EN-C, linear thermal expansion coefficient 13 ppm, glass transition temperature 320° C., Ra 0.03 μm", product of DU PONT-TORAY CO., LTD.) as a substrate using a bar coater. Then, the applied material was dried under the conditions of 60 to 120° C. and about 5 min to form a silane coupling layer having a thickness of 20 nm (silane coupling layer forming step). Next, a catalyst layer-forming material having a metal catalyst concentration of 0.25% by mass ("ML-300", product of IOX) was applied to the surface of the silane coupling layer using a bar coater. Then, the catalyst layer-forming material was dried under the conditions of 120° C. and about 10 min and further dried under the conditions of 240° C. and about 15 min to form a catalyst layer having a thickness of 50 nm to form a laminate precursor (catalyst layer forming step). Next, the laminate precursor was immersed in OPC COPPER HFS (initial Cu concentration 2.5 g/l, bath volume 500 ml, 40° C., 40 min), a product of Okuno Chemical Industries Co., Ltd., for about 1 min to form a copper plating layer having a thickness of 0.3 μm on the surface of the catalyst layer (chemical plating step). Further, the thickness of the copper plating layer was changed from 0.3 μm to 12 μm by electrolytic plating treatment (electrolytic plating step). Thus, a laminate was obtained.

Example 2

A laminate was obtained as in Example 1 except that a 2% by mass methanol solution of an epoxy silane coupling agent ("KBM-4803", product of Shin-Etsu Chemical Co., Ltd.) was applied instead of the 2% by mass methanol solution of the epoxy silane coupling agent ("KBM-403", product of Shin-Etsu Chemical Co., Ltd.) in the silane coupling layer forming step. The thicknesses of the layers of the laminate are the same as the thicknesses of the layers of the laminate of Example 1.

Example 3

A laminate was obtained as in Example 1 except that a 2% by mass methanol solution of an amine silane coupling agent ("KBM-903", product of Shin-Etsu Chemical Co., Ltd.) was applied instead of the 2% by mass methanol solution of the epoxy silane coupling agent ("KBM-403", product of Shin-Etsu Chemical Co., Ltd.) in the silane coupling layer forming step. The thicknesses of the layers of the laminate are the same as the thicknesses of the layers of the laminate of Example 1.

Comparative Example 1

A laminate was obtained as in Example 1 except that the silane coupling layer forming step was not performed, and the catalyst tank-forming material was applied to one surface of the substrate in the catalyst layer forming step. The thicknesses of the layers (substrate and copper plating layer) of the laminate are the same as the thicknesses of the layers of the laminate of Example 1.

Comparative Example 2

A laminate was obtained as in Comparative Example 1 except that a polyimide resin film comprising a thermosetting polyimide layer and thermoplastic polyimide layers disposed on both surfaces of the thermosetting polyimide layer, and having a thickness of 25 μm ("PIXEO FRS-142 #SW", product of KANEKA CORPORATION) was used instead of the thermosetting polyimide resin film ("Kapton 150EN-C", product of DU PONT-TORAY CO., LTD.) in the silane coupling layer forming step. The thickness of the copper plating layer is the same as the thicknesses of the layers of the laminate of Comparative Example 1.

The physical properties of the laminates of the Examples and the Comparative Examples were measured. The measurement results are shown in Table 1. The methods for measuring the physical properties were performed by the following methods.

The evaluation methods and the measurement methods are as follows.

[Peel Strength]

The measurement of peel strength was performed in accordance with JIS C6471. More particularly, an etching resist having a width of 3 mm was patterned on the copper plating layer surface of each laminate, and then the remaining copper plating layer was removed by etching to obtain a sample. The obtained sample was fixed to a reinforcing plate with double-sided tape, the copper plating layer was peeled from the reinforcing plate in the 180° direction, and strength measurement was performed to measure the peel strength. The peel speed was 50 mm/min. The evaluation criteria in the table are as follows.

(Evaluation Criteria)

◎: The peel strength was 5 N or more.

○: The peel strength was 3 N or more and less than 5 N.

X: The peel strength was less than 3 N.

[Peel Strength after Moist Heat Treatment]

An etching resist was patterned to a width of 3 mm on the copper plating layer surface of each laminate, and then the remaining copper plating layer was removed by etching to obtain a sample. Treatment was performed in a thermo-hygrostat adjusted at a temperature of 85° C. and a humidity of 85% for 240 h. The sample taken out of the thermo-hygrostat was fixed to a reinforcing plate with double-sided tape, the copper plating layer was peeled from the reinforcing plate in the 180° direction, and the peel strength was measured.

[Solder Heat Resistance Test]

Each laminate was cut to 30 mm×30 mm. Floating treatment was performed for 60 s with the copper plating layer side of each laminate being on the solder bath side. The appearance after the treatment was visually confirmed to confirm the presence or absence of shrinkage, blistering, and peeling. The test was performed every 10° C. from 240 to 340° C. to obtain the maximum temperature at which there was no presence or absence of shrinkage, blistering, and peeling. In Table 1, a case where any of shrinkage, blistering, and peeling occurred at 240° C. is described as "less than 240° C.", and a case where none of shrinkage, blistering, and peeling is seen at 340° C. is described as "340° C.<".

[Appearance after Chemical Plating]

For the Examples and the Comparative Examples, the appearance after the chemical plating step was visually observed to confirm the presence or absence of shrinkage, blistering, and peeling. In Table 1, a case where none of shrinkage, blistering, and peeling is seen is described as "○", and a case where any of shrinkage, blistering, and peeling was seen is described as "X".

TABLE 1

| Item | Unit | Example 1 | Example 2 | Example 3 | Comparative Example 1 | Comparative Example 2 |
|---|---|---|---|---|---|---|
| Peel strength normal state | N/cm | ◎<br>6.9 | ◎<br>6.3 | ◎<br>6.1 | ◎<br>7 | X<br>0.5 |
| Peel strength after moist heat treatment | N/cm | ○<br>4.9 | ○<br>3.3 | ○<br>4.3 | X<br>0.9 | —<br>— |
| Solder heat resistance | — | 340° C. | 340° C. | 340° C. | Less than 240° C. | Less than 240° C. |
| Appearance after chemical plating | — | ○ | ○ | ○ | ○ | X<br>(Partial peeling) |

As shown in Table 1, it is seen that the laminates of Examples 1 to 3 are better in solder heat resistance and moist heat resistance than the laminates of Comparative Examples 1 and 2.

This application is based on Japanese Patent Application No. 2018-043346 filed with the Japan Patent Office on Mar. 9, 2018, the contents of which are incorporated herein by reference.

INDUSTRIAL APPLICABILITY

The laminate of the present invention has industrial applicability as a material used for a flexible printed circuit.

The invention claimed is:

1. A laminate comprising:

a substrate;

an adhesive layer formed on at least one surface of both surfaces of the substrate so as to be in direct contact with the substrate; and a plating layer formed on a surface of the adhesive layer opposite to the substrate, wherein the adhesive layer comprises a plating catalyst containing a precious metal, and a silane coupling agent; wherein the content of the plating catalyst based on the entire adhesive layer is 1% by mass or more.

2. The laminate according to claim 1, wherein the adhesive layer has a silane coupling layer comprising the silane coupling agent, and a catalyst layer containing the plating catalyst, and the silane coupling layer and the catalyst layer are laminated in this order from the substrate toward the plating layer.

3. The laminate according to claim 1 or 2, wherein a thickness of the adhesive layer in a lamination direction is 0.001 to 2 μm.

4. The laminate according to claim 1 or 2, wherein the substrate has a linear thermal expansion coefficient of 20 ppm/K or less.

5. The laminate according to claim 1 or 2, wherein the substrate has a glass transition temperature of 300° C. or more.

6. The laminate according to claim 1 or 2, wherein a resin in the substrate is a thermosetting polyimide resin.

7. The laminate according to claim 1 or 2, wherein the silane coupling agent is a silane coupling agent containing an amino group, or a silane coupling agent containing an epoxy group.

8. The laminate according to claim 1 or 2, wherein the resin in the substrate is a thermosetting polyimide resin, and the silane coupling agent is a silane coupling agent containing an amino group, or a silane coupling agent containing an epoxy group.

9. The laminate according to claim 8, wherein the silane coupling agent is a silane coupling agent containing an epoxy group.

10. The laminate according to claim 1 or 2, wherein an average roughness Ra of at least one surface of the both surfaces of the substrate is 0.15 µm or less.

11. The laminate according to claim 1 or 2, wherein each average roughness Ra of the both surfaces of the substrate is 0.15 µm or less.

12. The laminate according to claim 1 or 2, wherein the adhesive layer contains a binder.

13. The laminate according to claim 12, wherein the binder is a thermosetting polyimide resin.

14. The laminate according to claim 1 or 2, wherein peel strength after charging into a thermo-hygrostat at a temperature of 85° C. and a humidity of 85% for 240 h is 3 N/cm or more in terms of 180° direction peeling.

15. The laminate according to claim 1 or 2, wherein the adhesive layer has a first adhesive layer formed on one surface of both surfaces of the substrate so as to be in direct contact with the substrate, and a second adhesive layer formed on the other surface of both surfaces of the substrate so as to be in direct contact with the substrate, and the plating layer has a first plating layer formed on a surface of the first adhesive layer opposite to the substrate, and a second plating layer formed on a surface of the second adhesive layer opposite to the substrate.

* * * * *